United States Patent
Ravkin et al.

(10) Patent No.: US 6,770,151 B1
(45) Date of Patent: Aug. 3, 2004

(54) DRYING A SUBSTRATE USING A COMBINATION OF SUBSTRATE PROCESSING TECHNOLOGIES

(75) Inventors: Michael Ravkin, Sunnyvale, CA (US); Katrina Mikhaylichenko, San Jose, CA (US); John M. deLarios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/196,497

(22) Filed: Jul. 15, 2002

Related U.S. Application Data

(60) Provisional application No. 60/305,372, filed on Jul. 13, 2001.

(51) Int. Cl.$^7$ ............................... B08B 7/04; B08B 3/02
(52) U.S. Cl. ............................................ 134/33; 134/36
(58) Field of Search ............................. 134/32, 33, 34, 134/36, 902, 30, 31

(56) References Cited

U.S. PATENT DOCUMENTS

| | | | |
|---|---|---|---|
| 5,271,774 A | * 12/1993 | Leenaars et al. | 134/31 |
| 5,634,980 A | * 6/1997 | Tomita et al. | 134/3 |
| 5,882,433 A | 3/1999 | Ueno | |
| 5,997,653 A | * 12/1999 | Yamasaka | 134/2 |
| 6,319,317 B1 | * 11/2001 | Takamori | 118/52 |
| 6,334,902 B1 | * 1/2002 | Mertens et al. | 134/1 |
| 6,485,782 B2 | * 11/2002 | Takamori | 427/240 |
| 6,491,764 B2 | * 12/2002 | Mertens et al. | 134/36 |

FOREIGN PATENT DOCUMENTS

| | | |
|---|---|---|
| EP | 0444756 | 9/1991 |
| EP | 0905747 | 3/1999 |
| JP | 7-211686 | 8/1995 |

\* cited by examiner

*Primary Examiner*—Frankie L. Stinson
*Assistant Examiner*—Saeed T Chaudhry
(74) *Attorney, Agent, or Firm*—Martine & Penilla, LLP

(57) ABSTRACT

Methods for rinsing and drying a substrate are provided. In one example, a method for rinsing and drying a substrate includes providing a substrate for processing and securing the substrate in a hollow spin chuck. The hollow spin chuck with the substrate positioned therein is rotated at a first rate of rotation while a rinsing agent and a surface tension modifying agent are dispensed at a position that is an approximate center of the spinning substrate on both an active surface and a backside surface of the substrate. The dispensing is moved from the approximate center of the spinning substrate radially outward towards a periphery of the substrate. The dispensing is then discontinued, and the hollow spin chuck with the substrate positioned therein is rotated at a second rate of rotation.

20 Claims, 7 Drawing Sheets

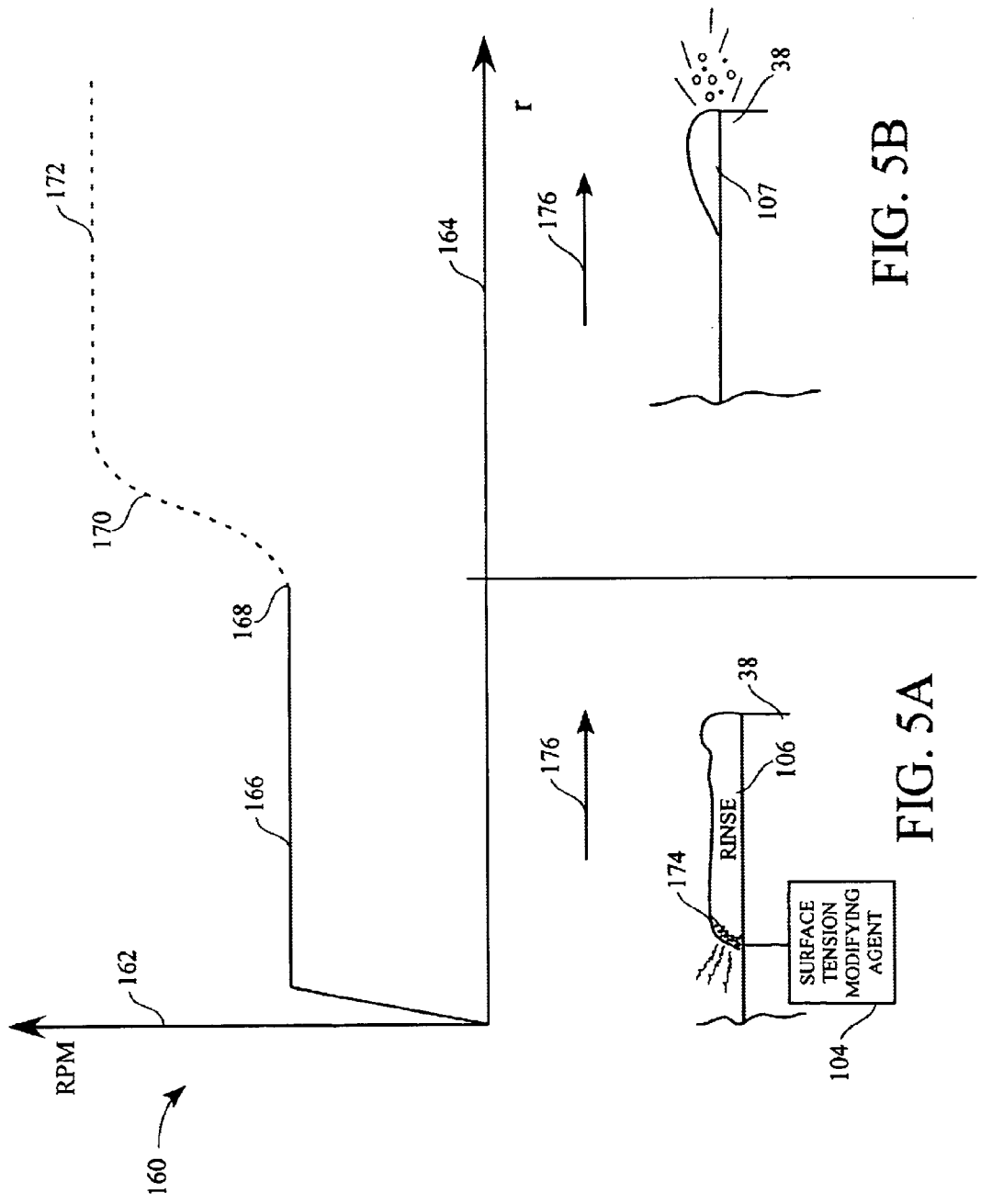

DRYING A SUBSTRATE USING A COMBINATION OF SUBSTRATE PROCESSING TECHNOLOGIES

CROSS REFERENCE TO RELATED APPLICATIONS

This application claims priority from U.S. Provisional Patent Application No. 60/305,372, filed Jul. 13, 2001, and entitled "DRYING A SUBSTRATE USING A COMBINATION OF SUBSTRATE PROCESSING TECHNOLOGIES." The disclosure of this application is incorporated herein by reference.

BACKGROUND OF THE INVENTION

1. Field of the Invention

The present invention relates generally to substrate and semiconductor wafer preparation systems and methods, and more particularly, the present invention relates to the drying of substrates and semiconductor wafers following a wet cleaning or processing operation using a combination of an isopropyl alcohol (IPA) assisted Marangoni/Spin relatively low rotational speed drying technique, and a relatively high speed spin drying technique.

2. Description of the Related Art

In the fabrication of semiconductor devices, there is a need to perform wet cleaning of substrates at various stages of the fabrication process. Wet cleans are designed to wash away any by-products of the fabrication process, remove contaminants, and to achieve and maintain the necessary degree of cleanliness essential to proceed to a subsequent fabrication operation. As transistor device structures become smaller and more complex, the precision required to achieve and maintain structure definition demands exacting standards of cleanliness be maintained in all process operations. If a wet clean is incomplete or ineffective, or if a post-wet clean drying is incomplete or ineffective, then unacceptable residue or contaminants are introduced into the processing environment.

Rinsing and drying techniques, methods, and apparatus are plentiful and known in the art, and incorporate such operations as rinsing and scrubbing, immersion, and the application of thermal, mechanical, chemical, electrical, or sonic energy and the like to remove or displace water and dry the substrate. While some scrub and rinse operations may employ acids or bases for vigorous interaction with fabrication by-products, deionized water (DIW) is commonly used to perform a final rinse before the desired drying technique is performed.

One common drying technique is known as spin, rinse and dry (SRD). SRD uses mechanical, centrifugal, energy to rid the substrate of water by spinning the substrate until dry. FIG. 1A is a block diagram of a typical prior art SRD process. First DIW, or some other rinsing agent, is applied in block 10 to rinse and/or clean the substrate, and then in block 20, the substrate is spun dry.

FIG. 1B shows a typical SRD tool 30. An SRD tool 30 typically includes a chuck 42 within a bowl 48. The chuck 42 is mounted on a spindle 46 that is configured to rotate as shown by arrow 44. A substrate 38 is attached to the chuck 42 with edge holding fingers 40 configured to maintain the substrate 38 in a horizontal orientation, firmly affixed to the chuck 42 so that spinning the chuck 42 on spindle 46 spins the substrate 38 and forces the DIW from the substrate 38 surface. DIW 36, or other processing fluid, is typically dispensed from a dispensing nozzle 34 which is positioned over the substrate 38 at the end of a fluid dispensing arm 32.

In some configurations, the substrate 38 is rinsed while the substrate 38 is spinning to ensure thorough rinsing, and then spun to dry. The spinning of the substrate 38 uses centrifugal energy to force water from the substrate 38 surface, and can be enhanced with the introduction of an inert gas such as Nitrogen or an inert gas vapor to displace any water that is not completely removed by spinning. Additional variations include heating the DIW, heating the SRD environment, heating the inert gas, and the like.

Another common drying technique is known as a Marangoni technique. Marangoni drying (not shown) typically includes using a chemical drying fluid or solvent such as isopropyl alcohol (IPA) to rinse the substrate after rinsing with DIW. The chemical drying fluid or solvent displaces the water on the surface of the substrate, evaporates, and the substrate is dried. Variations of the Marangoni technique also include the introduction of an inert gas such as Nitrogen to enhance evaporation of IPA and exclusion of oxygen, heating the Nitrogen, and the like.

Yet another drying technique that is evolving combines the Marangoni effect with the effects of centrifugal force. Generally, this combination of effects, hereinafter referred to as "Marangoni/Spin," includes the application of DIW or other rinsing agent to a surface of a rotating substrate, and immediately following the application of the DIW with an application of a vapor or gaseous substance so that the vapor or gaseous substance mixes with a trailing edge of the rinsing agent. The trailing edge of the rinsing agent is that region of the film of the rinsing agent near a point of application of the rinsing agent to the surface of the substrate and away from which the liquid film of rinsing agent on the surface of the rotating substrate travels by centrifugal force towards the edge of the substrate.

In Marangoni/Spin drying, the mixing of the vapor or gaseous substance with the liquid rinsing agent on the surface of the rotating substrate produces a mixture that lowers the surface tension of the liquid rinsing agent at the point of mixing. The lowered surface tension forms a defined barrier between the liquid rinsing agent and the vapor or gaseous substance at the trailing edge of the liquid film of the rinsing agent. As the substrate is rotated, the liquid film is forced radially outward from a center region towards the edge of the rotating substrate by centrifugal force. The barrier between the liquid and vapor or gaseous substance confines the liquid portion to the liquid film, and as the film is forced towards the edge of the substrate, the surface of the substrate is left dry with substantially all of the liquid being removed from the surface of the substrate. For further information and discussion of Marangoni/Spin principles and techniques, reference is drawn to U.S. Pat. No. 5,882,433, issued Mar. 16, 1999, and to published European Patent Application EP 0 905 747 A1, published on Mar. 31, 1999, the disclosures of both of which are herein incorporated by reference.

FIG. 1C shows a single-sided substrate drying tool 50 employing Marangoni/Spin drying techniques. The single-sided substrate drying tool 50 includes a chuck 58 mounted on a spindle 62 which is configured to rotate as shown by arrow 60. A substrate 38 is positioned on chuck 58 so that the substrate 38 is spun during the drying process. One or more dispensing arms 52 are positioned over the rotating substrate 38, and are configured to dispense a rinsing agent 56 on the surface of the spinning substrate 38. A vapor or gaseous substance (not shown) is dispensed or introduced immediately following the dispensing of the liquid rinsing agent 56. Nozzle 54 can be configured to dispense both the liquid, rinsing agent 56 and the vapor or gaseous substance, or two dispensing arms 52 can be configured immediately adjacent to one another such that as the dispensing arm 52 or arms are moved from a center region of the spinning substrate 38 towards the edge of the spinning substrate 38, the liquid rinsing agent 56 is dispensed on the surface of the spinning substrate 38 and immediately followed by the vapor or gaseous substance. In this manner, the vapor or gaseous substance mixes with the liquid rinsing agent at the trailing edge of the film of liquid rinsing agent, lowering the surface tension of the liquid film of rinsing agent at the point of mixing, and traveling radially outward on the surface of the spinning substrate 38 as shown by directional arrow 64.

Dual-sided wafer drying has become increasingly desired in substrate processing to meet stringent cleanliness requirements for ever more complex features. A significant limitation in the prior art is generally that methods and apparatus are not disclosed that enable dual-sided substrate drying. FIG. 1C is a typical example showing a single-sided substrate drying tool 50 that positions the substrate on a chuck which effectively blocks access to a backside of the substrate 38. As can be appreciated, even if the illustrated chuck 58 could somehow be modified to provide access to the backside of the substrate 38, there would need to be some mechanism to affix the substrate 38 to the chuck 58 without blocking or significantly limiting access to both top and backside surfaces of the substrate 38, and that would not reflect the liquid film of the rinsing agent back to the surface of the substrate 38.

Whichever method or combination of methods is employed to dry a substrate, effective drying is essential. What is needed is a method of drying a substrate that provides for dual-sided substrate drying, which enables the drying all the way to the edge of the substrate.

SUMMARY OF THE INVENTION

Broadly speaking, the present invention fills these needs by providing a method for substrate drying that results in effective substrate drying of both top and bottom surfaces of a substrate. The present invention can be implemented in numerous ways, including as a process, an apparatus, a system, a device, or a method. Several embodiments of the present invention are described below.

In one embodiment, A method for rinsing and drying a substrate is disclosed. The method includes providing a substrate for processing, and securing the substrate in a hollow spin chuck. The method further includes spinning the hollow spin chuck with the substrate positioned therein at a first rate of rotation. A rinsing agent is dispensed at a position that is an approximate center of the spinning substrate on both an active surface and a backside surface of the substrate, and a surface tension modifying agent is dispensed at the position that is the approximate center of the spinning substrate on both the active surface and the backside surface of the substrate. The dispensing of the rinsing agent and the surface tension modifying agent is then moved from the approximate center of the spinning substrate radially outward towards a periphery of the substrate. The dispensing of the rinsing agent and the surface tension modifying agent is discontinued on both the active surface and the backside surface of the substrate, and the hollow spin chuck with the substrate positioned therein is then rotated at a second rate of rotation.

In another embodiment, a process for cleaning and drying a wafer is disclosed. The process provides for securing the wafer to be cleaned and dried in a hollow spin chuck. The hollow spin chuck provides access to an active surface and a backside surface of the wafer. The process then provides for spinning the hollow spin chuck at a first rate of rotation. A rinsing agent and a surface tension modifying agent are applied to an approximate center of the spinning wafer on both the active surface and the backside surface. The rinsing agent and the surface tension modifying agent are applied immediately adjacent to one another and form a liquid-vapor boundary between the rinsing agent and the surface tension modifying agent. The process next includes moving the applying of the rinsing agent and the surface tension modifying agent from the approximate center of the spinning wafer radially outward towards an edge of the wafer. The moving is configured such that the rinsing agent precedes the surface tension modifying agent radially outward. The applying of the rinsing agent and the surface tension modifying agent is then discontinued, and spinning of the wafer is set to a second rate of rotation.

In still a further embodiment, a Marangoni/Spin method of simultaneously rinsing and drying an active surface and a backside surface of a substrate is disclosed. The Spin/Spin method includes securing the substrate in a hollow spin chuck, and then spinning the hollow spin chuck and the wafer secured therein at a first rate of rotation. A rinsing agent is dispensed to the active and backside surfaces of the spinning substrate at an approximate center of the substrate, and a surface tension modifying agent is likewise dispensed to the active and backside surfaces of the spinning substrate at the approximate center of the substrate. The dispensing of the rinsing agent and the surface tension modifying agent to the active and backside surfaces of the spinning substrate is then moved from the approximate center of the substrate radially outward towards a periphery of the substrate. The moving is configured such that the rinsing agent precedes the surface tension modifying agent moving from the approximate center towards the periphery of the substrate. The first rate of rotation is gradually decreased as the dispensing of the rinsing agent and the surface tension modifying agent is moved. The dispensing of the rinsing agent and the surface tension modifying agent is discontinued, and the spinning of the hollow spin chuck and the wafer secured therein is increased to a second rate of rotation.

The advantages of the present invention are numerous. One notable benefit and advantage of the invention is both the top surface and the backside surface of a substrate are simultaneously dried.

Another benefit is that the present invention is configurable for a plurality of substrate types and sizes. Any of a plurality of substrates requiring wet cleaning or wet fabrication processing, followed by a drying operation can be implemented in an embodiment of the present invention. The rate of rotation can be optimized for a particular size and type of substrate, and the specific rinsing and surface tension modifying agents can be modified for specific applications.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIG. 5A is a graph of the rotation of the substrate in revolutions per minute versus the radius of the substrate, in accordance with one embodiment of the present invention.

FIG. 5B is a graph of the rotation of the substrate in revolutions per minute versus the radius of the substrate, in accordance with one embodiment of the present invention.

DETAILED DESCRIPTION OF THE PREFERRED EMBODIMENTS

An invention for a method that provides for semiconductor wafer and other substrate drying using a Marangoni/Spin process to dry a circular area at a center of the wafer or substrate, and a spin process to dry the remaining area of the wafer or substrate is disclosed. The method includes simultaneous dual-sided wafer or other substrate drying. In preferred embodiments, the method includes securing a substrate with edge holders to allow access to both top and backside surfaces of a substrate, spinning the substrate, using Marangoni/Spin processing to dry the substrate to a predetermined radial position before the edge of the substrate, and then increasing the rate of rotation of the substrate to conclude the drying with spinning and centrifugal force.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
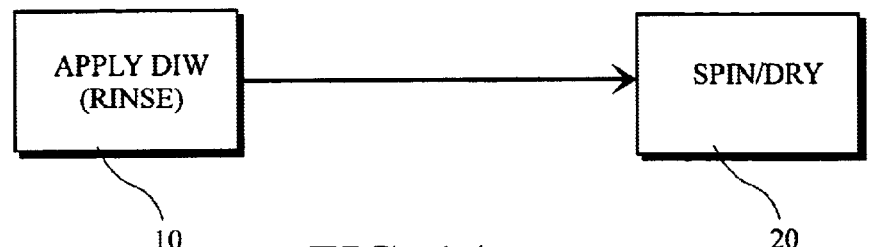
FIG. 1A is a block diagram of a typical prior art spin-rinse-dry process.
Figure 1B:
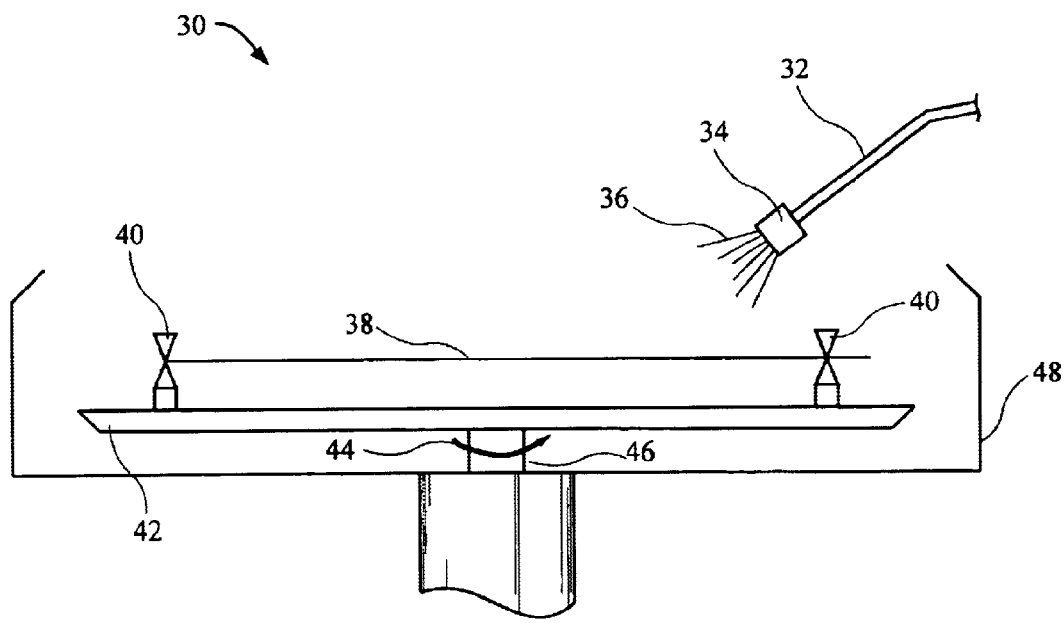
FIG. 1B shows a typical spin-rinse-dry tool.
Figure 1C:
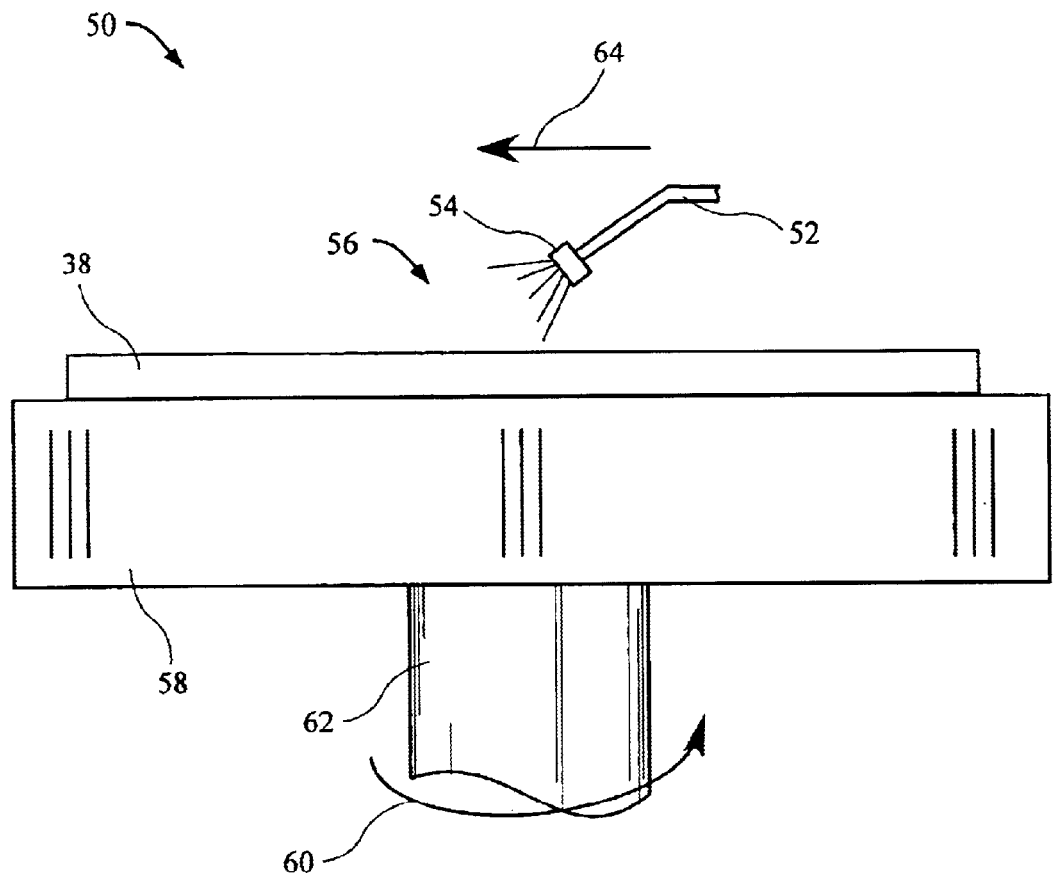
FIG. 1C shows a single-sided substrate drying tool employing Marangoni/Spin drying techniques.
Figure 2:
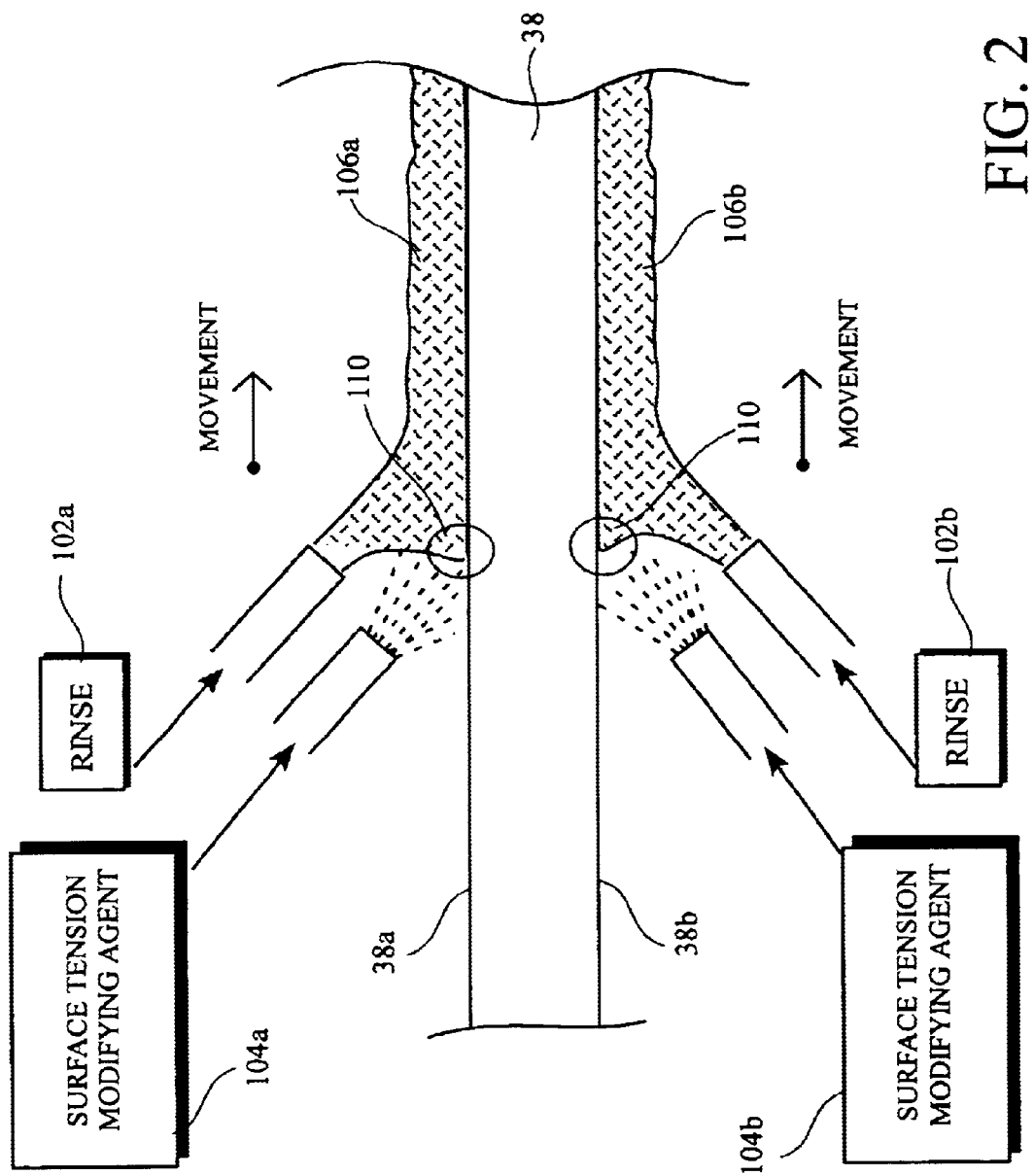
FIG. 2 shows the Marangoni/Spin substrate drying process applied to a top surface and a backside surface of a center region of a substrate in accordance with one embodiment of the present invention.

Marangoni/Spin drying is a relatively new process for single substrate drying based on the Marangoni principle. FIG. 2 shows the Marangoni/Spin substrate drying process applied to a top (also referred to as active) surface 38a and a backside surface 38b of a center region of a substrate 38 in accordance with one embodiment of the present invention. Substrate 38 is caused to spin. A rinse 102a is applied to a top surface 38a of the substrate 38 which forms a liquid rinse film 106a. Due to the spinning of the substrate 38, centrifugal force drives the liquid rinse film 106a radially outward from a center region of the substrate 38 to an edge of the substrate 38. In one embodiment, the rinse 102a is deionized water (DIW). In alternative embodiments, rinse 102a can include cleaning agents, weak acids, or other such liquids to wash, rinse, or otherwise clean the surface of the substrate 38.

Surface tension modifying agent 104a is applied to the top surface 38a of the substrate 38 immediately following the rinse 102a. Surface tension modifying agent 104a is configured to be applied to the topside surface 38a of spinning substrate 38 and mix with the liquid rinse film 106a at a trailing edge of the liquid rinse film 106a in mixing region 110. In one embodiment, surface tension modifying agent is a vapor of IPA in Nitrogen. Nitrogen is bubbled through liquid IPA to form a vapor of IPA in carrier gas Nitrogen. In alternative embodiments, the surface tension modifying agent 104a can include any of several inert carrier gases such a Argon, Helium, Krypton, and the like. The mixing of the surface tension modifying agent 104a and the liquid rinse film 106a lowers the surface tension of the liquid rinse film 106a. The lowering of the surface tension of the liquid vapor mixture to a surface tension that is lower than that of the liquid rinse film 106a creates a liquid-vapor boundary at 110 which contains the liquid to the liquid rinse film 106a region. As the liquid rinse film 106a moves radially outward towards the edge of the substrate, the boundary 110 moves with the trailing edge of the liquid rinse film 106a, thereby drying the top surface 38a of the substrate 38.

Although described in reference to the top surface 38a of the substrate 38, complementary features operate on the backside 38b of substrate 38. On the backside surface 38b, rinsing agent 102b is applied followed by surface tension modifying agent 104b. Liquid rinse film 106b is formed on the backside surface 38b of the substrate 38.

Figure 3:
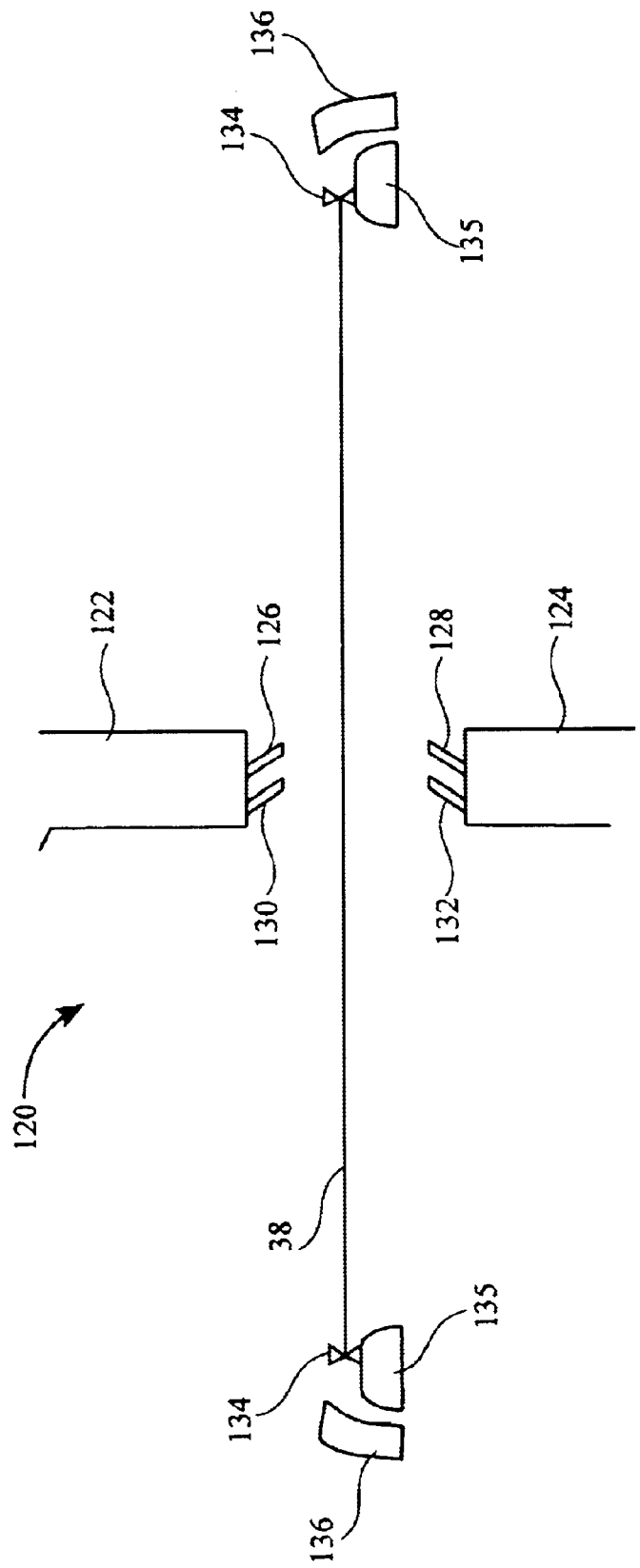
FIG. 3 shows a Marangoni/Spin drying tool used in the implementation of one embodiment of the present invention.

FIG. 3 shows a Marangoni/Spin drying tool 120 used in the implementation of one embodiment of the present invention. A Marangoni/Spin drying tool 120 provides for dispensing a rinsing agent and a surface tension modifying agent to the surface of a rotating substrate 38, and moving the application from a center region of the spinning substrate 38 to an outer region of the spinning substrate 38. The Marangoni/Spin drying tool 120 illustrated in FIG. 3 is configured for dual-sided substrate drying.

Upper dispense arm 122 is configured to position upper rinse dispensing nozzle 126 and upper surface tension modifying agent dispensing nozzle 130 over a top surface of substrate 38. Lower dispense arm 124 is configured to position lower rinse dispensing nozzle 128 and lower surface tension modifying agent dispensing nozzle 132 over the backside surface of substrate 38. Edge holding fingers 134 secure substrate 38 to hollow chuck 135. Hollow chuck 135 is configured to provide substantially full access to the backside of substrate 38. Edge holding fingers 134 are configured to grip edges of substrate 38 with minimal obstruction of substrate 38 access. In one embodiment, the obstruction of a substrate 38 at each edge holding finger 134 ranges from one to three millimeters in footprint.

Hollow chuck 135 is configured to spin substrate 38, and upper dispense arm 122 and lower dispense arm 124 position the nozzles 126, 128, 130, and 132 for the application of a rinsing agent immediately followed by a surface tension modifying agent on both the top surface and the backside surface of substrate 38 starting at a center region and moving towards the edge of the spinning substrate. In one embodiment of the invention, nozzles 126, 128, 130, and 132 are angled to directionally dispense rinsing agent and surface tension modifying agent toward a periphery or edge of the substrate 38. As is described in greater detail below, rotating substrate 38 and upper and lower dispense arms 122, 124, facilitate the application of the rinsing agent and the surface tension modifying agent from a center of substrate 38 to a periphery of substrate 38. Spray shield 136 is provided to contain any excess liquid that may be thrown from a spinning substrate 38. For additional description of a Marangoni/Spin drying tool 120 and its implementation, reference is drawn to co-pending U.S. patent application Ser. No. 10/151,664, filed on May 17, 2002, entitled "APPARATUS AND METHOD FOR SUBSTRATE PREPARATION IMPLEMENTING A SURFACE TENSION REDUCING PROCESS," assigned to the same assignee as the present invention, and which is herein incorporated by reference.

Figure 4A:
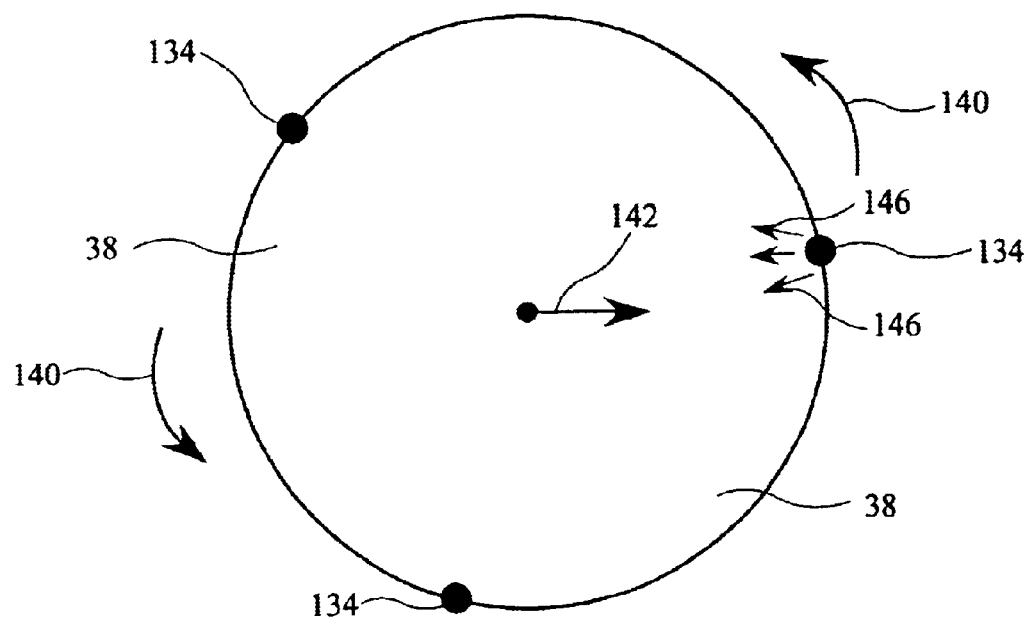
FIG. 4A shows a substrate configured in edge holding fingers in accordance with an embodiment of the present invention.

FIG. 4A shows a substrate 38 configured in edge holding fingers 134 in accordance with an embodiment of the present invention. FIG. 4A shows a single surface of a substrate 38, but it should be appreciated that illustrated principles apply to both a top surface and a backside surface of a substrate 38. In one embodiment, three edge holding fingers 134 secure the substrate 38 to a hollow chuck (not shown in FIG. 4A). The hollow chuck is configured to rotate and thereby spin substrate 38, as indicated by rotational arrows 140. The application of a rinsing agent immediately followed by a surface tension modifying agent is initiated from a center region of the spinning substrate 38 and moves outward toward the periphery or edge of the spinning substrate 38 as indicated at 142. As the liquid film leaves the surface of the spinning substrate 38 at the edge, some of the liquid is reflected back towards the surface of the substrate 38 at the edge holding fingers 134 as indicated at 146. In one embodiment of the present invention, the combination of Marangoni/Spin drying and spin drying is configured to substantially eliminate any liquid droplets from remaining on the surface of the substrate 38 and preventing the effective and complete drying of the substrate 38.

Figure 4B:
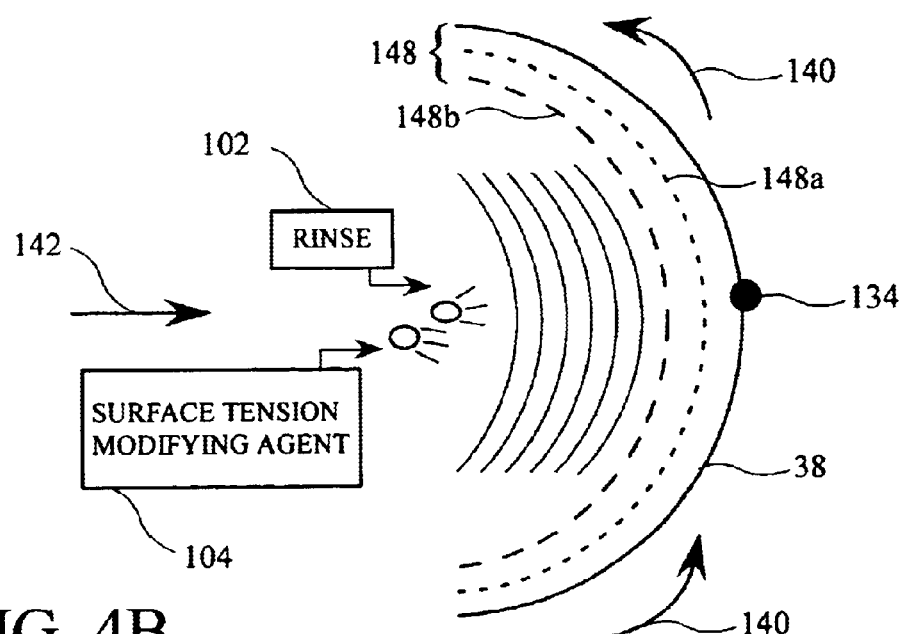
FIG. 4B shows a detailed view of the progression of the combination of Marangoni/Spin drying and spin drying on the surface of the substrate in accordance with one embodiment of the invention.

FIG. 4B shows a detailed view of the progression of the combination of Marangoni/Spin drying and spin drying on the surface of the substrate 38 in accordance with one embodiment of the invention. A single surface is illustrated, but it should be appreciated that the instant principles apply to both the top surface and backside surface of substrate 38. In one embodiment, substrate 38 is spinning as shown by rotational arrows 140, and the application of rinse 102 immediately followed by surface tension modifying agent 104 progresses from a center region of spinning substrate 38 towards edge of substrate 38. Edge holding fingers 134 may obstruct a footprint of approximately one to three millimeters, and thereby prevent nozzles (not shown in FIG. 4A) from applying the rinse 102 and surface tension modifying agent 104 all the way to the edge of spinning substrate 38. Additionally, the continued application as the nozzles approach the edge holding fingers 134 increase the likelihood of reflection of liquid off the edge holding fingers 134 back on to the surface of the substrate 138. Typically, in the fabrication of semiconductor wafers, an exclusion zone 148 exists at the extreme edge of a substrate due to limitations on fabrication operations at the extreme edge of the substrate 38. The exclusion zone 148, however, does not prevent the effective utilization of the extreme edge of the substrate 38, but recognizes limitations. In one embodiment of the present invention, complete drying of a substrate is not a limiting factor in exclusion zones 38. At a predetermined point prior to the edge of the spinning substrate 38, the Marangoni/Spin drying process is discontinued, and the spin drying process is used to complete the drying process, and thereby effectively and completely dry the surfaces of the substrate 38. In one embodiment of the invention, the predetermined point of transition from Marangoni/Spin to spin drying approximately coincides with the exclusion zone. The width of the outer region in which spin drying is used to conclude the drying of the substrate varies depending on such factors as the size of the substrate, the specific rinse 102 used, the specific surface tension modifying agent 104 used, the rate of rotation of the substrate, temperature, pressure, and other such variables. In one embodiment of the invention, the width of the outer region of the spinning substrate 38 that is spin dried ranges from approximately ten to five millimeters. In FIG. 4B, the spin dry region is illustrated as exclusion zone 1 boundary 148a and exclusion zone 2 boundary 148b. In one embodiment, the regions dried by spin drying are from approximately 148b to the outer edge of the substrate 38, to 148a to the outer edge of the substrate 38.

FIGS. 5A and 5B are the left and right sides of a graph 160 of the rotation of the substrate in revolutions per minute (RPM) 162 versus the radius of the substrate 164, in accordance with one embodiment of the present invention. In FIG. 5A, the origin of the graph 160 is at an approximate center of the substrate 38. In one embodiment, the substrate 38 is rotated at a first rate of rotation 166. The first rate of rotation 166 is that rate of rotation used for the Marangoni/Spin drying and generally ranges from approximately 50 RPM to 500 RPM. A typical rate of rotation 166 for the Marangoni/Spin drying is between approximately 200 RPM and 300 RPM.

Below the curve of graph 160 in FIG. 5A, a partial surface of a substrate 38 is illustrated. Liquid rinse film 106 is shown ahead of surface tension modifying agent 104, with centrifugal force 176 driving the liquid rinse film 106 and surface tension modifying agent 104 outward toward the edge of substrate 38. Gradient 174 shows that region in which the mixing of the vapor or gaseous medium of the surface tension modifying agent 104 with the liquid of the liquid rinse film 106 to form the liquid-vapor boundary discussed above in reference to FIG. 2.

In one embodiment of the invention, an end of the first rate of rotation occurs at a point in which the application of the rinse and surface tension modifying agent is stopped 168. In one embodiment, the surface tension modifying agent is secured first, followed by the rinse. In another embodiment, the surface tension modifying agent and the rinse are secured at the same time. In either embodiment, after the application is halted, the RPM is increased as shown at curve 170.

Graph 160 continues to FIG. 5B in which a second rate of rotation 172 is shown that is faster than the first rate of rotation 166, in accordance with one embodiment of the invention. The second rate of rotation 172 is set following the securing of the application at point 168, and the increase curve 170. In one embodiment of the invention, the second rate of rotation 172 ranges from approximately 800 RPM to approximately 2000 RPM. In one embodiment in which a 200 mm substrate is being dried, the second rate of rotation 172 is approximately 2000 RPM. In one embodiment in which a 300 mm substrate is being dried, the second rate of rotation 172 is approximately 1500 RPM. The second rate of rotation 172 is typically maintained until the outer region of the substrate surfaces are dry, the drying including the removal of any remaining rinse by centrifugal force.

Below the curve of graph 160 in FIG. 5B, a partial surface of substrate 38 is shown with the remaining rinse 170 being removed by centrifugal force 176 in accordance with one embodiment of the invention. With no continued application of rinse and surface tension modifying agent, the vapor has dissipated, no gradient remains, and the remaining rinse 170 is residual liquid film that is removed and dried by centrifugal force. Because no additional rinse is applied, in one embodiment of the invention, the amount of liquid at the edge of the substrate is minimal, and therefore reflection is minimal, if at all. The amount of liquid is sufficient, however, to effectively rinse the extreme edge of the substrate before drying, in one embodiment.

The embodiment of the present invention illustrated in FIGS. 5A and 5B utilizes an approximately constant first rate of rotation 166 and second rate of rotation 172. In another embodiment of the invention, the first rate of rotation 166 and the second rate of rotation 172 are variable. By way of example, in one embodiment, the first rate of rotation 166 remains in the range of approximately 50 to 500 RPM, but starts at an initial first rate of rotation at a center region of the spinning substrate, and gradually decreases RPM towards a terminal first rate of rotation at a predetermined radial position on the spinning substrate before the edge of the spinning substrate. The RPM of the first rate of rotation gradually decreases as the application progresses outward from the center of the spinning substrate towards the edge of the spinning substrate.

Figure 6:
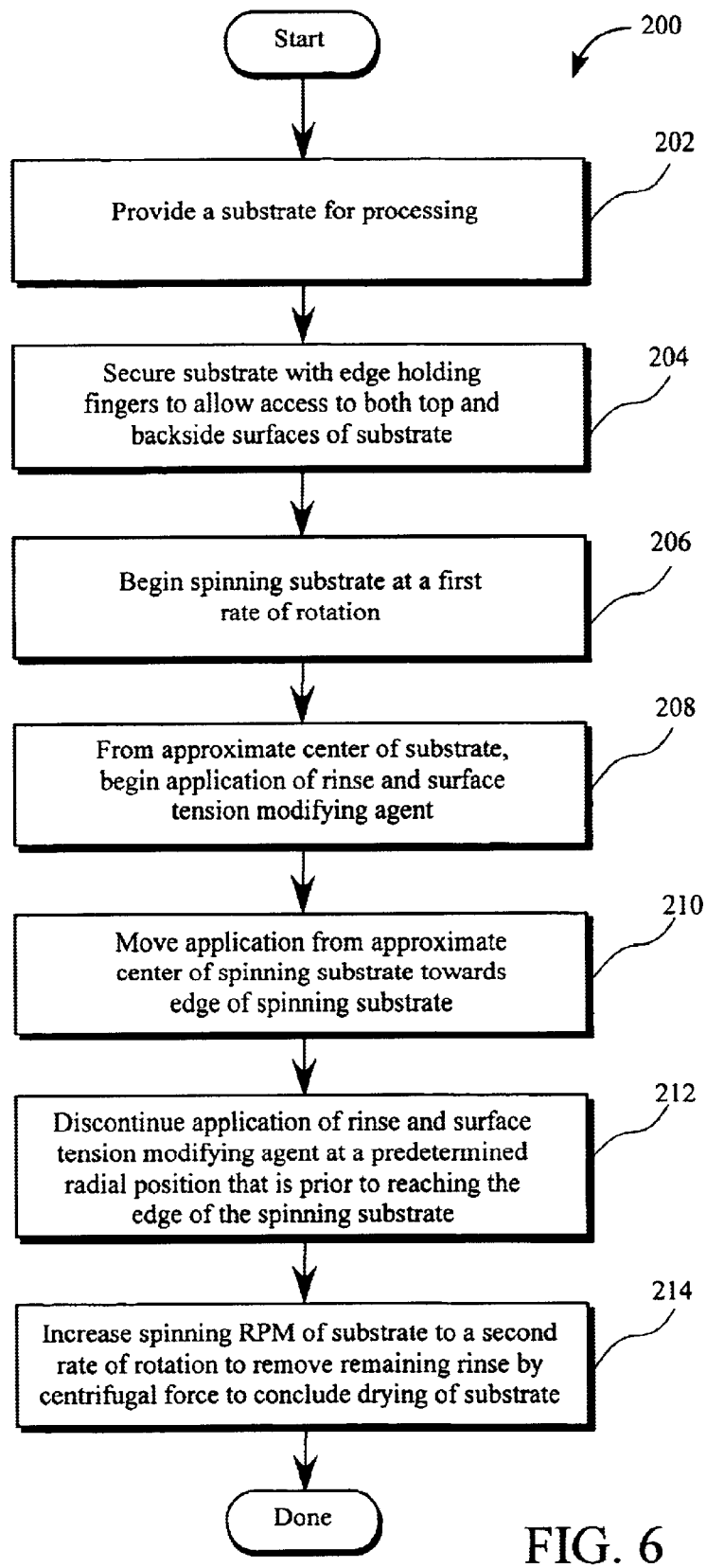
FIG. 6 shows a flow chart diagram illustrating the method operations of drying a substrate using a combination of Marangoni/Spin and spin drying processes in accordance with one embodiment of the invention.

FIG. 6 shows a flow chart diagram 200 illustrating the method operations of drying a substrate using a combination of Marangoni/Spin and spin drying processes in accordance with one embodiment of the invention. The method begins with operation 202 in which a substrate is provided for processing. In one embodiment, the processing is the drying of a substrate following a wet cleaning operation during fabrication, and alternative embodiments include drying of a substrate following any other fabrication process in which the substrate was processed in liquid and requires drying.

The method continues with operation 204 in which the substrate is secured with edge holding fingers to allow access to both a top and a backside surface of the substrate. In one embodiment, the edge holding fingers secure the substrate to a hollow chuck that is configured to rotate, and provides access to both the top and backside surfaces of a substrate as illustrated and described in reference to FIG. 3.

The method advances to operation 206 in which the substrate is spun at a first rate of rotation. In one embodiment the first rate of rotation is typically less than 500 RPM, and ranges from approximately 50 RPM to approximately 500 RPM. A typical first rate of rotation is approximately 200–300 RPM. In one embodiment, the first rate of rotation is achieved and kept substantially constant through the Marangoni/Spin drying process. In another embodiment, the first rate of rotation is achieved and then gradually decreased as the Marangoni/Spin process progresses outward from a center region towards an edge region of the spinning substrate.

The method next proceeds with operation 208 and the application of a rinse followed immediately by surface tension modifying agent beginning at an approximate center of the spinning substrate. With the substrate spinning at a first rate of rotation, the Marangoni/Spin drying process begins with the application of the rinse and surface tension modifying agent at an approximate center of the substrate.

The method continues with operation 210. The application of the rinse immediately followed by the surface tension modifying agent is moved radially outward from the approximate center of the spinning substrate towards the edge of the substrate. As the rinse is applied, a liquid film forms on the surface of the spinning surface. In one embodiment, the surface tension modifying agent is an IPA vapor in Nitrogen gas. The Nitrogen gas serves as a carrier gas for the vaporized IPA. In one embodiment, Nitrogen gas is bubbled through liquid IPA to create the surface tension modifying agent. In other embodiments, inert gasses such as Argon, Helium, Krypton, and the like are used as carrier gasses for vaporized IPA and other such surface tension modifying agents.

As the vapor or gaseous substance of the surface tension modifying agent mixes with the liquid of the rinse, a liquid-vapor barrier is formed at an approximate trailing edge of the liquid film on the surfaces (top and backside) of the substrate. In one embodiment, the liquid-vapor barrier contains surface liquid to the liquid film of the rinse, and as the centrifugal force drives the liquid film rinse outward on the substrate surfaces, the surface behind the liquid-vapor barrier is dry.

The method next advances to operation 212 in which the application of rinse and surface tension modifying agent is discontinued at a predetermined radial position that is prior to reaching the edge of the spinning substrate. In one embodiment, the application of the rinse and surface tension modifying agent is accomplished by dispense arms that position dispensing nozzles over the top and backside surfaces of the spinning substrate. The dispense arms are configured to mirror the positioning of the nozzles over the top surface and the backside surface of the substrate, and therefore the discontinuing of the application is at substantially identical positions on top and backside surfaces, and substantially the same time.

In one embodiment of the invention, the discontinuing of the application of the rinse and surface tension modifying agent is at substantially the same time. In another embodiment, the application of the surface tension modifying agent is discontinued and then the application of the rinse is discontinued.

The method proceeds with operation 214 in which the spinning RPM of the substrate is increased to a second rate of rotation to remove any remaining rinse at the edge surfaces of the spinning substrate by centrifugal force to conclude the drying of the substrate. In one embodiment, the second rate of rotation ranges from approximately 800 RPM to 2000 RPM. Operation 214 is a spin dry operation to dry the wafer, and the final drying operation. The rate of rotation varies with such factors as the size of the substrate being dried, the rinsing agent used, temperature, pressure, and other such variables. By way of example, a 200 mm semiconductor wafer, rinsed with DIW, and at standard day conditions might have a second rate of rotation of approximately 2000 RPM in one embodiment of the invention. In another example, a 300 mm semiconductor wafer, rinsed with DIW, and at standard day conditions might have a second rate of rotation of approximately 1500 RPM.

The second rate of rotation in operation 214 spins the final outer region of the top and backside surfaces of a substrate dry. With no continued application of rinse and surface tension modifying agent, the vapor or gaseous substance dissipates, and the remaining liquid on the surfaces is without the previous liquid-vapor barrier. The remaining liquid is then removed by centrifugal force in the outer-most region of the substrate, and the method is done.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for rinsing and drying a substrate, comprising:

providing a substrate for processing;

securing the substrate in a hollow spin chuck;

spinning the hollow spin chuck with the substrate positioned therein at a first rate of rotation;

dispensing a rinsing agent at a position that is an approximate center of the spinning substrate on both an active surface and a backside surface of the substrate;

dispensing a surface tension modifying agent at the position that is the approximate center of the spinning substrate on both the active surface and the backside surface of the substrate;

moving the dispensing of the rinsing agent and the surface tension modifying agent from the approximate center of the spinning substrate radially outward towards a periphery of the substrate;

discontinuing the dispensing of the rinsing agent and the surface tension modifying agent on both the active surface and the backside surface of the substrates at an exclusion zone boundary adjacent to a peripheral edge of the substrate, the exclusion zone boundary being between about 5 mm and about 10 mm toward the approximate center of the substrate from the peripheral edge of the substrate; and spinning the hollow spin chuck with the substrate positioned therein at a second rate of rotation.

2. The method for rinsing and drying a substrate of claim 1, wherein the rinsing agent and the surface tension drying agent are dispensed such that the rinsing agent precedes the surface tension modifying agent as the dispensing is moved from the approximate center of the spinning substrate radially outward towards the periphery of the substrate.

3. The method for rinsing and drying a substrate of claim 1, wherein the substrate is 200 mm semiconductor wafer.

4. The method for rinsing and drying a substrate of claim 3, wherein the second rate of rotation is approximately 2000 RPM.

5. The method for rinsing and drying a substrate of claim 1, wherein the substrate is a 300 mm semiconductor wafer.

6. The method for rinsing and drying a substrate of claim 5, wherein the second rate of rotation is approximately 1500 RPM.

7. The method for rinsing and drying a substrate of claim 1, wherein the first rate of rotation ranges between approximately 50 RPM and 500 RPM.

8. The method for rinsing and drying a substrate of claim 1, wherein the first rate of rotation ranges between approximately 200 RPM and 300 RPM.

9. The method for rinsing and drying a substrate of claim 1, wherein the second rate of rotation ranges between approximately 800 RPM to 2000 RPM.

10. The method for rinsing and drying a substrate of claim 1, wherein the surface tension modifying agent is isopropyl alcohol vapor in an inert carrier gas.

11. The method for rinsing and drying a substrate of claim 10, wherein the inert carrier gas is Nitrogen.

12. The method for rinsing and drying a substrate of claim 10, wherein the inert carrier gas is one of Argon, Helium, and Krypton.

13. The method for rinsing and drying a substrate of claim 1, wherein the first rate of rotation gradually decreases during the moving of the dispensing of the rinsing agent and the surface tension modifying agent from the approximate center of the spinning substrate radially outward towards a periphery of the substrate.

14. A process for cleaning and drying a wafer, comprising:
securing the wafer to be cleaned and dried in a hollow spin chuck, the hollow spin chuck providing access to an active surface and a backside surface of the wafer;

spinning the hollow spin chuck at a first rate of rotation;

applying a rinsing agent and a surface tension modifying agent to an approximate center of the spinning wafer on both the active surface and the backside surface, the rinsing agent and the surface tension modifying agent being applied immediately adjacent to one another and forming a liquid-vapor boundary between the rinsing agent and the surface tension modifying agent;

moving the applying of the rinsing agent and the surface tension modifying agent from the approximate center of the spinning wafer radially outward towards an edge of the wafer, the moving configured such that the rinsing agent precedes the surface tension modifying agent radially outward;

discontinuing the applying of the rinsing agent and the surface tension modifying agent, the discontinuing occurring at a boundary of an exclusion zone adjacent to the edge of the wafer; and spinning the wafer at a second rate of rotation.

15. The process of claim 14, wherein the applying of the surface tension modifying agent is discontinued before the applying of the rinsing agent is discontinued.

16. The process of claim 14, wherein the first rate of rotation is a gradually decreasing rate of rotation.

17. The process of claim 16, wherein the first rate of rotation begins at range of approximately 200 RPM to 300 RPM.

18. The process of claim 14, wherein the second rate of rotation ranges between approximately 800 RPM and 2000 RPM.

19. The process of claim 14, wherein the discontinuing the applying of the rinsing agent and the surface tension modifying agent is at a predetermined radial position on the active surface and the backside surface of the wafer that is prior to the edge of the wafer.

20. A Marangoni/Spin method of simultaneously rinsing and drying an active surface and a backside surface of a substrate, the method comprising:

securing the substrate in a hollow spin chuck;

spinning the hollow spin chuck and the wafer secured therein at a first rate of rotation;

dispensing a rinsing agent to the active and backside surfaces of the spinning substrate at an approximate center of the substrate;

dispensing a surface tension modifying agent to the active and backside surfaces of the spinning substrate at the approximate center of the substrate;

moving the dispensing of the rinsing agent and the surface tension modifying agent to the active and backside surfaces of the spinning substrate from the approximate center of the substrate radially outward towards a periphery of the substrate, the moving being configured such that the rinsing agent precedes the surface tension modifying agent moving from the approximate center towards the periphery of the substrate;

gradually decreasing the first rate of rotation during the dispensing of the rinsing agent and the surface tension modifying agent;

discontinuing the dispensing of the rinsing agent and the surface tension modifying agent at a boundary of an exclusion zone adjacent to the periphery of the substrate, the boundary being between approximately 5 mm and approximately 10 mm from a peripheral edge of the substrate; and increasing the spinning of the hollow spin chuck and the wafer secured therein to a second rate of rotation.

* * * * *